(12) United States Patent
Hamada

(10) Patent No.: US 9,136,495 B2
(45) Date of Patent: Sep. 15, 2015

(54) ORGANIC LIGHT-EMITTING DEVICE

(75) Inventor: Yuji Hamada, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 451 days.

(21) Appl. No.: 13/101,777

(22) Filed: May 5, 2011

(65) Prior Publication Data

US 2011/0278558 A1    Nov. 17, 2011

(30) Foreign Application Priority Data

May 14, 2010 (KR) ........................ 10-2010-0045474

(51) Int. Cl.
- $H01L\ 51/54$ (2006.01)
- $H01L\ 51/52$ (2006.01)
- $H01L\ 51/50$ (2006.01)
- $H01L\ 51/00$ (2006.01)

(52) U.S. Cl.
CPC ........ H01L 51/5048 (2013.01); H01L 51/5016 (2013.01); H01L 51/5088 (2013.01); H01L 51/0072 (2013.01); H01L 51/0077 (2013.01); H01L 51/0085 (2013.01); H01L 51/0092 (2013.01)

(58) Field of Classification Search
None
See application file for complete search history.

(56) References Cited

U.S. PATENT DOCUMENTS

| | | | |
|---|---|---|---|
| 2002/0179899 A1* | 12/2002 | Nakayama et al. | 257/40 |
| 2004/0066139 A1* | 4/2004 | Hamada et al. | 313/506 |
| 2005/0173700 A1* | 8/2005 | Liao et al. | 257/40 |
| 2005/0208330 A1* | 9/2005 | Raychaudhuri et al. | 428/690 |
| 2006/0027830 A1* | 2/2006 | Kumaki et al. | 257/103 |
| 2006/0063031 A1* | 3/2006 | Brown et al. | 428/690 |
| 2007/0092753 A1* | 4/2007 | Begley et al. | 428/690 |
| 2007/0096644 A1 | 5/2007 | Nishimura et al. | |
| 2007/0231596 A1* | 10/2007 | Spindler et al. | 428/690 |
| 2009/0167159 A1 | 7/2009 | Song et al. | |
| 2009/0189509 A1 | 7/2009 | Qiu et al. | |
| 2009/0218938 A1 | 9/2009 | Takeda et al. | |
| 2009/0315452 A1 | 12/2009 | Lim et al. | |
| 2010/0096622 A1 | 4/2010 | Iizumi et al. | |

FOREIGN PATENT DOCUMENTS

| | | |
|---|---|---|
| JP | 2000-164362 | 6/2000 |
| JP | 2006-041395 | 2/2006 |
| JP | 2007-123611 | 5/2007 |
| JP | 2007-142111 | 6/2007 |
| JP | 2007-207916 | 8/2007 |
| JP | 2009-164578 | 7/2009 |
| JP | 2009-182322 | 8/2009 |

(Continued)

OTHER PUBLICATIONS

JPO Office action dated Jan. 20, 2015, for corresponding Japanese Patent application 2011-103046, (4 pages).

(Continued)

*Primary Examiner* — J. L. Yang

(74) *Attorney, Agent, or Firm* — Christie, Parker & Hale, LLP

(57) ABSTRACT

An organic light-emitting device including a first electrode, a plurality of hole transport layers, a plurality of intermediate layers, an emission layer, a plurality of electron transport layers, and a second electrode. The emission layer may include a host, an emitting dopant, and an auxiliary dopant. The host and the auxiliary dopant are able to transport different types of carriers.

16 Claims, 2 Drawing Sheets

(56) References Cited

FOREIGN PATENT DOCUMENTS

| | | |
|---|---|---|
| JP | 2009-231807 | 10/2009 |
| JP | 2010-004031 | 1/2010 |
| KR | 10-20030036669 A | 5/2003 |
| KR | 10-20040086599 A | 10/2004 |
| KR | 10-20050031942 A | 4/2005 |
| WO | WO 2008/102644 A1 | 8/2008 |

OTHER PUBLICATIONS

JPO Decision of Refusal dated Jul. 28, 2015, for corresponding Japanese Patent application 2011-103046, (4 pages).

* cited by examiner

ORGANIC LIGHT-EMITTING DEVICE

CROSS-REFERENCE TO RELATED APPLICATIONS

This application claims the benefit of Korean Patent Application No. 10-2010-0045474, filed on May 14, 2010, in the Korean Intellectual Property Office, the disclosure of which is incorporated herein in its entirety by reference.

BACKGROUND

1. Field

The invention relates to an organic light-emitting device, and more particularly, to an organic light-emitting device having improved emission efficiency and driving voltage.

2. Description of the Related Art

Organic light-emitting devices are self-emitting devices displaying images by using light generated while electrons and holes injected through an anode and a cathode, respectively, recombine in an emission layer or at the interface between a carrier transport layer and the emission layer.

In order to improve the emission efficiency of an organic light-emitting device, the balance of electrons and holes injected into the emission layer should be appropriately tuned.

An emission site may shift according to the relative number of electrons or holes injected into the emission layer. For example, if the number of holes is greater than that of electrons, the emission site in the emission layer may shift close to an electron transport layer. On the other hand, if the number of electrons is greater than that of holes, the emission site may shift in the emission layer to be close to a hole transport layer. Such a shift of the emission site affects the efficiency and lifetime characteristics of organic light-emitting devices.

A method widely used for tuning the charge balance of electrons and holes injected into the emission layer is to vary materials used to form the hole transport layer and the electron transport layer.

However, the balance of the carriers achieved with this method is not satisfactory, and thus, there is still a demand for further improvement.

SUMMARY

One aspect of the invention provides an organic light-emitting device in which the balance of carriers injected into an emission layer is efficiently achieved, and thus emission efficiency and lifetime characteristics are improved. In addition, image sticking and black non-uniformity are prevented, and thus the image quality is improved.

According to another aspect of the invention, an organic light-emitting display device includes a first electrode, a plurality of hole transport layers, a plurality of intermediate layers, an emission layer, a plurality of electron transport layers, and a second electrode, in which the emission layer includes a host, an emitting dopant and an auxiliary dopant, the host and the auxiliary dopant are able to transport different types of carriers, and the emission layer includes at least one layer selected from the group consisting of a red emission layer, a blue emission layer and a green emission layer.

According to another aspect of the invention, an organic light-emitting device is provided, in which a host of a red emission layer includes at least one material selected from the group consisting of bis{2-(2-hydroxyphenyl) benzothiazolate}zinc and bis-(2-methyl-8-quinolinolate)-4-(phenylphenolate)aluminum.

According to another aspect of the invention, an organic light-emitting device is provided, in which an emitting dopant of a red emission layer includes at least one material selected from the group consisting of an iridium complex and a platinum complex.

According to yet another aspect of the invention, an organic light-emitting device is provided, in which an auxiliary dopant of each of a red emission layer, a blue emission layer and a green emission layer includes a phenylamine derivative.

According to yet another aspect of the invention, an organic light-emitting device is provided, in which a host of each of a blue emission layer and a green emission layer includes at least one material selected from the group consisting of an anthracene derivative and a carbazole-based compound.

According to yet another aspect of the invention, an organic light-emitting device is provided, in which an emitting dopant of a blue emission layer includes at least one material selected from the group consisting of 2,5,8,11-tetra-tert-butylphenylene and a styryl derivative.

According to yet another aspect of the invention, an organic light-emitting device is provided, in which an emitting dopant of a green emission layer includes at least one material selected from the group consisting of an iridium complex and an anthracene derivative.

According to yet another aspect of the invention, an organic light-emitting device is provided, in which a plurality of electron transport layers includes at least one layer selected from the group consisting of a first emission layer including a first electron transport material; and a second electron transport layer including a second electron transport material and a metal compound represented by Formula 1 below:

$$X_a Y_b \quad\quad\quad \text{Formula 1}$$

wherein

X is an alkali metal, an alkali earth metal or a transition metal;

Y is a Group 7 element or a C1-C20 organic group;

a is an integer from 1 to 3; and b is an integer from 1 to 3.

According to yet another aspect of the invention, an organic light-emitting device is provided, in which the organic light-emitting device includes a metal reflection layer.

According to yet another aspect of the invention, an organic light-emitting device is provided, in which the organic light-emitting device includes an electron injection layer.

Additional aspects and/or advantages of the invention will be set forth in part in the description which follows and, in part, will be apparent from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
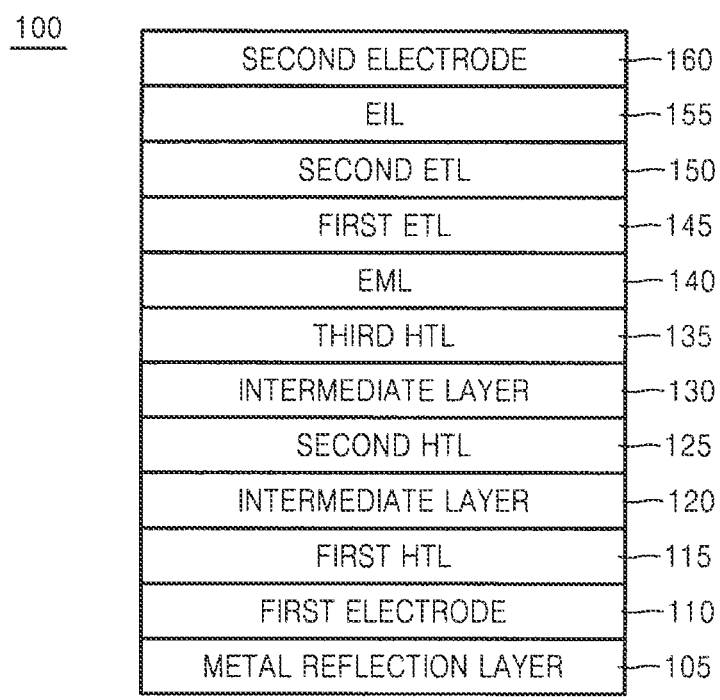
FIGS. 1 and 2 are sectional views of organic light-emitting devices according to embodiments of the invention.

Reference will now be made in detail to representative embodiments, examples of which are illustrated in the accompanying drawings, wherein like reference numerals refer to like elements throughout. The representative embodiments described herein may have different forms and should not be construed as being limited to the descriptions set forth herein.

According to one aspect of the invention, an organic light-emitting device includes a first electrode, a plurality of hole transport layers (HTLs), a plurality of intermediate layers, an emission layer (EML), a plurality of electron transport layers (ETLs), and a second electrode.

The plurality of HTLs and the plurality of intermediate layers may be alternately stacked upon one another, forming a stack structure including a first HTL, an intermediate layer, a second HTL, another intermediate layer, and a third HTL, which are sequentially arranged upon one another.

The EML includes a host, an emitting dopant, and an auxiliary dopant. The host and the auxiliary dopant are able to transport different types of carriers.

In the organic light-emitting device, according to one embodiment, if the host of the EML is a material having electron transport characteristics, the auxiliary dopant of the EML may be a material having hole transport characteristics. On the other hand, if the host of the EML is a material having hole transport characteristics, the auxiliary dopant of the EML may be a material having electron transport characteristics. When the EML has such a composition as described above, it may be easier to tune the balance of carriers.

The auxiliary dopant of the EML may be selected from among an aromatic amine and a condensed polycyclic aromatic compound.

The emitting dopant of the EML is a phosphorescent material, for example, having a ratio of the luminescence efficiency at 1 nit to the luminescence efficiency at 1000 nit, which is represented as (cd/A @1 nit/cd/A @1000 nit), the ratio being 1.0 or greater.

The EML may include at least one layer selected from the group consisting of a red EML, a blue EML and a green EML.

A host of the red EML may include at least one material selected from the group consisting of bis(2-(2-hydroxyphenyl)benzothiazolato) zinc (Zn(BTZ)$_2$) and bis-(2-methyl-8-quinolinolate)-4-(phenylphenolate)aluminium. An emitting dopant of the red EML may include at least one material selected from the group consisting of an iridium complex and a platinum complex.

Examples of the iridium complex include tris(2-phenylisoquinoline) iridium and tris(2-phenylpyridinato)iridium.

An auxiliary dopant of the red EML may be a phenylamine derivative.

For example, the phenylamine derivative may be selected from the group consisting of N,N'-diphenyl-N,N'-di(1-naphthyl)-1,1'-biphenyl-4,4'-diamine (NPB) having the chemical formula shown below, and N,N'-diphenyl-N,N'-di(3-methylphenyl)-1,1'-biphenyl-4,4'-diamine (TPD) having the chemical formula shown below.

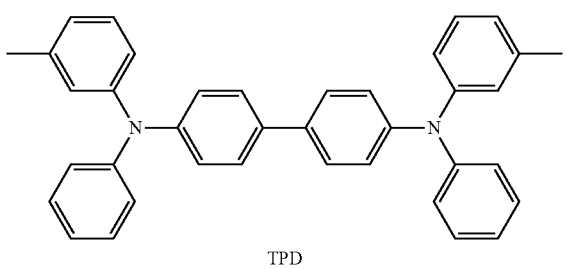

TPD

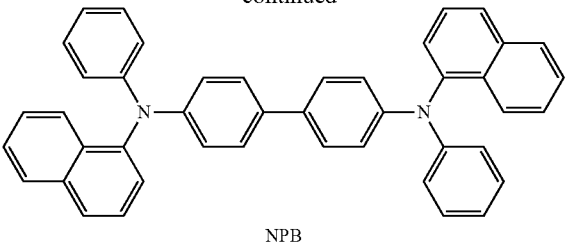

NPB

A host of the blue EML may include at least one material selected from the group consisting of an anthracene derivative and a carbazole-based compound. An emitting dopant of the blue EML may include at least one material selected from the group consisting of 2,5,8,11-tetra-tert-butylphenylene and a styryl derivative. One example of an auxiliary dopant of the blue EML is a phenylamine derivative.

For example, the phenylamine derivative of the red EML and the blue EML may be selected from the group consisting of N,N'-diphenyl-N,N'-di(1-naphthyl)-1,1'-biphenyl-4,4'-diamine (NPB) having the chemical formula shown below, and N,N'-diphenyl-N,N'-di(3-methylphenyl)-1,1'-biphenyl-4,4'-diamine (TPD) having the chemical formula shown below.

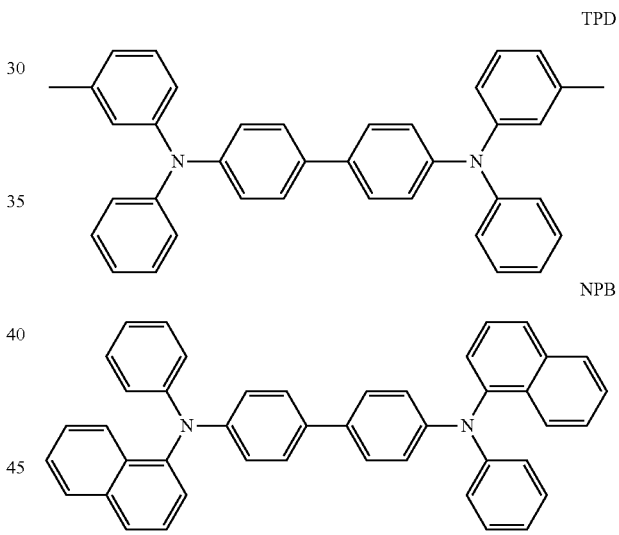

A host of the green EML may include at least one material selected from the group consisting of an anthracene derivative and a carbazole-based compound. An emitting dopant of the green EML may include at least one material selected from the group consisting of an iridium complex and an anthracene derivative. One example of an auxiliary dopant of the green EML is a phenylamine derivative.

Examples of the iridium complex include tris(2-phenylisoquinoline) iridium and tris(2-phenylpyridinato)indium.

With regard to the host of the blue EML and the green EML, the anthracene derivative may be 9,10-(2-dinaphthyl) anthracene (ADN). The carbazole-based compound may be 4,4'-(carbazole-9-yl)biphenyl (CBP).

In each of the blue EML and the green EML, the amount of the emitting dopant may be in a range of about 0.1 to about 49 parts by weight, for example, about 1 to about 25 parts by weight, based on 100 parts by weight of the host. The amount of the auxiliary dopant may be in a range of about 0.1 to about 49 parts by weight, for example, about 1 to about 40 parts by weight, based on 100 parts by weight of the host.

In the red EML, the amount of the emitting dopant may be in a range of about 0.1 to about 49 parts by weight, for example, about 0.3 to about 25 parts by weight, based on 100 parts by weight of the host. The amount of the auxiliary dopant may be in a range of about 0.1 to about 49 parts by weight, for example, about 5 to about 30 parts by weight, based on 100 parts by weight of the host.

When the amounts of the emitting dopant and the auxiliary dopant in each of the blue, green and red EMLs are within these ranges, emission efficiency may be good.

Due to the plurality of HTLs, for example, including the first HTL, the second HTL and the third HTL as described above, the organic light-emitting device may have good hole transport characteristics.

The first HTL, the second HTL, and the third HTL may each include at least one hole transport material independently selected from the group consisting of N,N'-diphenyl-N,N'-di(1-naphthyl)-1,1'-biphenyl-4,4'-diamine (NPB) and N,N'-diphenyl-N,N'-di(3-methylphenyl)-1,1'-biphenyl-4,4'-diamine (TPD).

The intermediate layers, which are disposed to alternate with the plurality of HTLs, generate charges.

A material for forming the intermediate layers may include at least one material selected from the group consisting of 1,4,5,8,9,12-hexaazatriphenylenehexanitrile and tetracyanoquinodimethane (TCNQ).

A fourth HTL including at least one material selected from the group consisting of N,N'-diphenyl-N,N'-di(1-naphthyl)-1,1'-biphenyl-4,4'-diamine (NPB) and N,N'-diphenyl-N,N'-di(3-methylphenyl)-1,1'-biphenyl-4,4'-diamine (TPD) may be further disposed between the third HTL and the EML. The fourth HTL may improve the ability to inject holes into the EML.

The ETLs of the organic light-emitting device may include at least one layer selected from the group consisting of a first ETL including a first electron transport material, and a second ETL including a second electron transport material and a metal compound represented by Formula 1 below. The second ETL has good electron transport abilities due to its composition.

$$X_a Y_b \quad \text{Formula 1:}$$

wherein

X is an alkali metal, an alkali earth metal or a transition metal;

Y is a Group 17 element or a C1-C20 organic group;

a is an integer from 1 to 3; and b is an integer from 1 to 3.

For example, the metal compound of Formula 1 may include at least one compound selected from the group consisting of lithium quinolate, sodium quinolate, lithium acetoacetate, magnesium acetoacetate, lithium fluoride, cesium fluoride, and sodium fluoride.

In the organic light-emitting device, injection of electrons may be facilitated without an electron injection layer (EIL).

For example, the first electron transport material may include at least one material selected from the group consisting of bis(10-hydroxybenzo[h]quinolinato)beryllium (Bebq2) represented by Formula 2 below, a derivative thereof, 8-hydroxyquinoline zinc (Znq2) and (8-hydroxyquinoline) aluminum (Alq3).

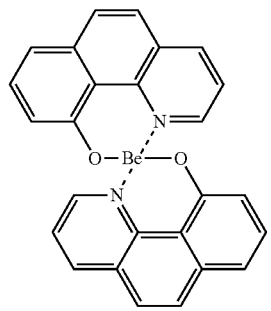

Formula 2

The second electron transport material may include an electron transport material having an electron mobility of about $10^{-8}$ cm/V or greater, which is substantially the same as that of the first electron transport material. The second electron transport material may be a material having substantially the same composition as or a different composition from that of the first electron transport material. However, when the first electron transport material and the second electron transport material are substantially the same composition, the mobility of charges may be improved.

The amount of the metal compound in the second ETL may be in a range of about 40 to about 80 parts by weight, for example, about 50 to about 75 parts by weight, based on 100 parts by weight of the second electron transport material. When the amount of the metal compound of Formula 1 is within these ranges, the electron transport characteristics of the second ETL may be significantly improved.

A thickness ratio of the first ETL to the second ETL may be in a range of about 1:1 to about 2:1.

The organic light-emitting device may further include a metal reflection layer. The metal reflection layer may include at least one metal selected from the group consisting of silver (Ag) and aluminum (Al).

For example, the metal reflection layer may be used to manufacture a top-emission organic light-emitting device.

Active-matrix organic light-emitting devices for use in portable devices, such as mobile phones, should have low power consumption and be free from image sticking and black non-uniformity.

The power consumption of an organic light-emitting device varies, based on emission characteristics, according to the emission efficiency and the driving voltage thereof. That is to say, the higher the emission efficiency and the lower the driving voltage, the lower the power consumption.

Image sticking refers to a phenomenon whereby afterimages remain in part of a screen, and is also related to the lifetime of organic light-emitting devices. Such image sticking may be improved by preventing deterioration of an initial luminance.

Black non-uniformity refers to the emission of specific color light in a dark room, which may degrade the quality of images.

The organic light-emitting device described above may reduce power consumption and may prevent image sticking and black non-uniformity, and thus may have a very wide range of applications.

Figure 2:
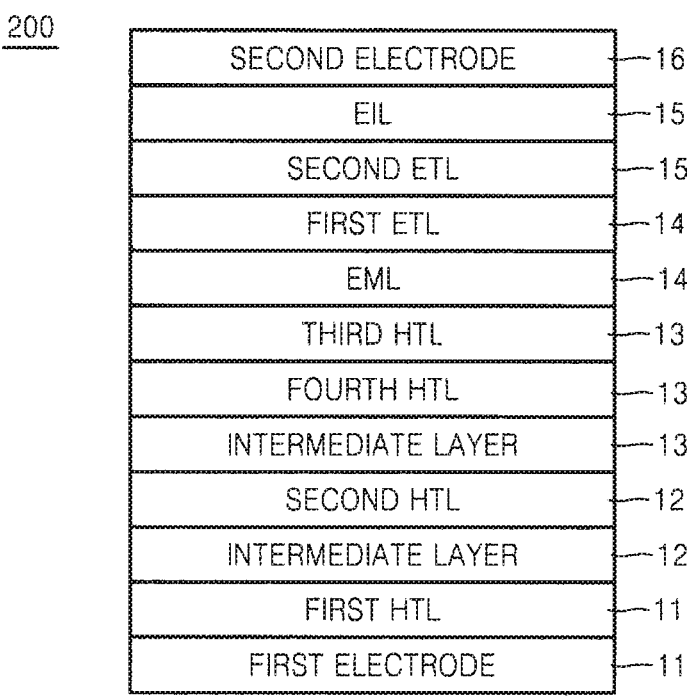

FIGS. 1 and 2 are cross-sectional views of organic light-emitting devices, each having a stacked structure, according to embodiments of the present invention.

Referring to FIG. 1, the organic light-emitting device 100 according to one aspect of the invention includes a metal reflection layer 105 disposed on a substrate (not shown); and a first electrode 110, a first HTL 115, a first intermediate layer 120, a second HTL 125, a second intermediate layer 130, a third HTL 135, an EML 140, a first ETL 145, a second ETL 150, an EIL 155, and a second electrode 160, which are sequentially arranged on the metal reflection layer 105.

Referring to FIG. 2, the organic light-emitting device 200 according to another aspect of the invention has substantially the same structure as the organic light-emitting device of FIG. 1, in which the same reference numerals are shown corresponding to the same elements as shown in FIG. 1, except that a fourth HTL 133 is further disposed between the third HTL 135 and the second intermediate layer 130.

The ETL may have a single-layer structure including either a first ETL 145 formed of a first electron transport material, or a second ETL 150 formed of a second electron transport material and the metal compound of Formula 1. Alternatively, the ETL may have a double-layer structure including a first ETL 145 formed of a first electron transport material, and a second ETL 150 formed of a second electron transport material and the metal compound of Formula 1.

Hereinafter, a method of manufacturing the organic light-emitting devices of FIGS. 1 and 2, according to one aspect of the invention, will be described.

Initially, the metal reflection layer 105 is formed on the substrate (not shown). The metal reflection layer 105 may be formed of at least one material selected from the group consisting of silver (Ag) and aluminum (Al) to a thickness of, for example, about 100 to about 5000 nm. When the thickness of the metal reflection layer 105 is within this range, the metal reflection layer 105 is easily prepared.

Then, the first electrode 110 is formed as a pattern on the metal reflection layer 105. The substrate, which may be any substrate that is used in organic light-emitting devices, may be a glass substrate or a transparent plastic substrate with good mechanical strength, thermal stability, transparency, surface smoothness, ease of handling, and water resistance. The substrate may have a thickness of about 0.3 to about 1.1 mm.

The first electrode 110 may be formed of a transparent and highly conductive material, such as indium tin oxide (ITO), indium zinc oxide (IZO), tin oxide ($SnO_2$), or zinc oxide (ZnO).

The plurality of HTLs and the plurality of intermediate layers are formed on the first electrode 110, for example, by using a movable source-material containing unit that is movable across the entire substrate.

The first HTL 115 may be formed of a first hole transport material on the first electrode 110, and then an intermediate layer forming material may be deposited on the first HTL 115 to form the first intermediate layer 120.

The second HTL 125 may be formed of a second hole transport material on the first intermediate layer 120, and then another intermediate layer forming material may be deposited on the second HTL 125 to form a second intermediate layer 130.

Each of the intermediate layers may have a thickness of about 0.1 to about 100 nm, for example, about 1 to about 20 nm.

The third HTL 135 may be formed of a third hole transport material on the second intermediate layer 130.

Then, a host, an emitting dopant and an auxiliary dopant, which are EML forming materials, are deposited on the third HTL 135 to form the EML 140. The EML 140 may be formed, for example, using vacuum deposition, spin coating, casting, Langmuir-Blodgett (LB) deposition, or another suitable technique.

The ETL is formed of an electron transport material on the EML 140. The ETL may have a single-layer structure including a first ETL 145 formed of a first electron transport material. Alternatively, the ETL may have a double-layer structure including a first ETL 145 formed of a first electron transport material and a second ETL 150 formed of a second electron transport material and the metal compound of Formula 1, as illustrated in FIG. 1.

The ETL may be formed using vacuum deposition.

The first ETL 145 may have a thickness of about 1 to about 20 nm, and the second ETL 150 may have a thickness of about 10 to about 50 nm. When the thickness of the ETL is within this range, the ETL may have good electron transport ability without a substantial increase in driving voltage.

Next, the EIL 155 may be formed of an electron injection material on the ETL. The organic light-emitting device 100 of FIG. 1 may have good electron injection ability without the EIL 155. However, the electron injection ability may be further improved when the EIL 155 is formed of a material that may facilitate the injection of electrons from the cathode on the ETL.

The EML 140 may have a thickness of about 10 nm to about 500 nm, for example, about 50 nm to about 120 nm. A blue EML of the EML may have a thickness of about 70 nm. When the thickness of the EML 140 is within this range, the emission efficiency and the lifetime may be improved without substantial increases in leakage current and driving voltage.

The HTLs, intermediate layer, and ETLs may be formed using vacuum deposition, spin coating, casting, or LB deposition. However, when the HTLs, intermediate layer, and ETLs are formed using vacuum deposition, the HTLs, intermediate layer, and ETLs may be uniform, and occurrence of pin holes may be suppressed. When the HTLs and the intermediate layers are formed using vacuum deposition, the deposition and coating conditions may vary according to a material that is used to form the HTLs, intermediate layer, and ETLs.

Each of the HTLs may have a thickness of about 5 to about 100 nm.

Examples of the electron injection material include LiF, NaCl, CsF, $Li_2O$, BaO, and lithium quinolate. Deposition conditions for forming the EIL 155 are similar to those used to form the ETL, although the deposition conditions may vary according to the material that is used to form the EIL 155.

The EIL 155 may have a thickness of about 1 to about 8 nm.

A cathode as the second electrode 160 is formed of a cathode-forming metal on the EIL 155 by using vacuum deposition or sputtering, thereby completing the manufacture of the organic light-emitting device 100 of FIG. 1. Examples of the cathode-forming metal include lithium (Li), magnesium (Mg), aluminum (Al), aluminum-lithium (Al—Li), calcium (Ca), magnesium-indium (Mg—In), and magnesium-silver (Mg—Ag). In addition, a transparent cathode formed of ITO or IZO may be used to manufacture a top-emission light-emitting device.

The organic light-emitting device 200 of FIG. 2 may be manufactured in substantially the same manner as described above, except that the metal reflection layer 105 of FIG. 1 is not formed.

The inventive concept will now be described in greater detail with reference to the following examples. These examples are presented for illustrative purposes only and do not limit the scope of the inventive concept.

Example 1

A silver (Ag) layer and an ITO layer were sequentially formed on a glass substrate to a thickness of about 100 nm and about 7 nm, respectively. Next, the glass substrate was washed with distilled water, and then ultrasonically washed in isopropyl alcohol and then in pure water for 5 minutes each, followed by drying in a vacuum oven for 1 hour.

N,N'-diphenyl-N,N'-di(1-naphthyl)-1,1'-biphenyl-4,4'-diamine (NPB) was deposited on the ITO layer to form a first hole transport layer (HTL) having a thickness of about 34 nm, and 1,4,5,8,9,12-hexaazatriphenylenehexanitrile (HAT-CN6) as an intermediate layer material was deposited thereon to form an intermediate layer having a thickness of about 5 nm.

NPB was deposited on the intermediate layer to form a second HTL having a thickness of about 68 nm, and HAT-CN6 was then deposited thereon to form another intermediate layer having a thickness of about 5 nm. NPB was then deposited on the intermediate layer to form a third HTL having a thickness of about 34 nm.

Subsequently, a red EML having a thickness of about 40 nm was formed on the third HTL by using 62 parts by weight of bis(2-(2-hydroxyphenyl)benzothiazolato) zinc (Zn (BTZ)$_2$) as a host, 8 parts by weight of tris(2-phenylisoquinoline)iridium as an emitting dopant, and 30 parts by weight of NPB as an auxiliary dopant.

A first ETL having a thickness of about 10 nm was formed using 2,9-dimethyl-4,7-diphenyl-1,10-phenanthroline (BCP) on the red EML. A second ETL having a thickness of about 30 nm was formed on the first ETL by using 50 parts by weight of BCP and 50 parts by weight of lithium quinolate (LiQ).

Then, LiF was vacuum-deposited on the second ETL to form an electron injection layer (EIL) having a thickness of about 0.5 nm.

MgAg was deposited on the EIL to form a cathode, thereby completing the manufacture of an organic light-emitting device.

Example 2

An organic light-emitting device was manufactured in the same manner as in Example 1, except that a green EML, instead of the red EML, was formed.

The green EML was formed using 88 parts by weight of 4,4'-bis(carbazol-9-yl) biphenyl (CBP) as a host, 10 parts by weight of tris(2-phenylpyridinato)iridium as an emitting dopant, and 1 part by weight of N,N'-diphenyl-N,N'-di(1-naphthyl)-1,1'-biphenyl-4,4'-diamine) (NPB) as an auxiliary dopant to achieve a thickness of about 20 nm.

Example 3

An Ag layer and an ITO layer were sequentially formed on a glass substrate to a thickness of about 100 nm and about 7 nm, respectively. Next, the glass substrate was washed with distilled water, and then ultrasonically washed in isopropyl alcohol and then in pure water for 5 minutes each, followed by drying in a vacuum oven for 1 hour.

NPB was deposited on the ITO layer to form a first HTL having a thickness of about 34 nm, and 1,4,5,8,9,12-hexaazatriphenylenehexanitrile (HAT-CN6) as an intermediate layer material was deposited thereon to form an intermediate layer having a thickness of about 5 nm.

NPB was deposited on the intermediate layer to form a second HTL having a thickness of about 68 nm, and HAT-CN6 was then deposited thereon to form another intermediate layer having a thickness of about 5 nm. NPB was then deposited on the intermediate layer to form a third HTL having a thickness of about 34 nm.

Next, a blue EML was formed on the third HTL to have a thickness of about 20 nm by using 95.5 parts by weight of 9,10-(2-dinaphthyl)anthracene (ADN) as a host, 3 parts by weight of 2,5,8,11-tetra-tert-butylphenylene as an emitting dopant, and 1.5 parts by weight of NPB as an auxiliary dopant.

2,9-Dimethyl-4,7-diphenyl-1,10-phenanthroline (BCP) was deposited on the EML to form a first ETL having a thickness of about 5 nm, and 50 parts by weight of BCP and 50 parts by weight of lithium quinolate (LiQ) were deposited thereon to form a second ETL having a thickness of about 25 nm.

Then, LiF was vacuum-deposited on the second ETL to form an EIL having a thickness of about 0.5 nm.

MgAg was deposited on the EIL to form a cathode, thereby completing the manufacture of an organic light-emitting device.

Example 4

An organic light-emitting device was manufactured in the same manner as in Example 3, except that a blue EML was formed on the third HTL to have a thickness of about 20 nm by using 96 parts by weight of ADN as a host, 3 parts by weight of 2,5,8,11-tetra-tert-butylphenylene as an emitting dopant, and 1 part by weight of NPB as an auxiliary dopant.

Example 5

An organic light-emitting device was manufactured in the same manner as in Example 4, except that a second ETL having a thickness of about 30 nm was formed of 60 parts by weight of BCP and 40 parts by weight of LiQ by using deposition.

Example 6

An organic light-emitting device was manufactured in the same manner as in Example 4, except that N,N'-diphenyl-N,N'-di(3-methylphenyl)-1,1'-biphenyl-4,4'-diamine (TPD), instead of NPB, was used to form a second HTL and a third HTL.

Example 7

An organic light-emitting device was manufactured in the same manner as in Example 4, except that 87 parts by weight of ADN as a host, 3 parts by weight of 2,5,8,11-tetra-tert-butylphenylene as an emitting dopant, and 10 parts by weight of NPB as an auxiliary dopant were used to form an EML having a thickness of about 20 nm.

Example 8

An organic light-emitting device was manufactured in the same manner as in Example 4, except that 96.5 parts by weight of ADN as a host, 3 parts by weight of 2,5,8,11-tetra-tert-butylphenylene as an emitting dopant, and 0.5 parts by weight of NPB as an auxiliary dopant were used to form an EML having a thickness of about 20 nm.

Comparative Example 1

NPB was deposited on an ITO layer to form a HTL having a thickness of about 146 nm.

Subsequently, a red EML having a thickness of about 40 nm was formed on the HTL by using 62 parts by weight Zn(BTZ)$_2$ as a host, 8 parts by weight of tris(2-phenylisoquinoline)iridium as an emitting dopant, and 30 parts by weight of NPB as an auxiliary dopant.

Then, an ETL having a thickness of about 30 nm was formed on the red EML by using 50 parts by weight of 2,9-dimethyl-4,7-diphenyl-1,10-phenanthroline and 50 parts by weight of LiQ.

Then, LiF was vacuum-deposited on the ETL to form an EIL having a thickness of about 0.5 nm.

MgAg was deposited on the EIL to form a cathode, thereby completing the manufacture of an organic light-emitting device.

Comparative Example 2

An organic light-emitting device was manufactured in the same manner as in Example 2, except that, instead of the stack structure obtained by sequentially forming the first HTL, an intermediate layer, the second HTL, another intermediate layer, and the third HTL on the ITO, a single-layer HTL having a thickness of about 146 nm was formed of NPB on the ITO layer.

Comparative Example 3

An organic light-emitting device was manufactured in the same manner as in Example 3, except that, instead of the stack structure obtained by sequentially forming the first HTL, an intermediate layer, the second HTL, another intermediate layer, and the third HTL on the ITO, a single-layer HTL having a thickness of about 146 nm was formed of NPB on the ITO layer.

Comparative Example 4

An organic light-emitting device was manufactured in the same manner as in Example 4, except that, instead of the stack structure obtained by sequentially forming the first HTL, an intermediate layer, the second HTL, another intermediate layer, and the third HTL on the ITO, a single-layer HTL having a thickness of about 146 nm was formed of NPB on the ITO layer.

Comparative Example 5

An organic light-emitting device was manufactured in the same manner as in Example 5, except that, instead of the stack structure obtained by sequentially forming the first HTL, an intermediate layer, the second HTL, another intermediate layer, and the third HTL on the ITO, a single-layer HTL having a thickness of about 146 nm was formed of NPB on the ITO layer.

Comparative Example 6

An organic light-emitting device was manufactured in the same manner as in Example 6, except that, instead of the stack structure obtained by sequentially forming the first HTL, an intermediate layer, the second HTL, another intermediate layer, and the third HTL on the ITO, a single-layer HTL having a thickness of about 146 nm was formed of TPD on the ITO layer.

The driving voltage, current density, luminescent efficiency and color coordinate of each of the organic light-emitting devices of Examples 1 through 8 and Comparative Examples 1 through 6 were measured. The results are shown in Table 1 below.

TABLE 1

| Example | Driving voltage (V) | Current density (mA/cm$^2$) | Luminescent efficiency (cd/A) | CIE (x, y) |
| --- | --- | --- | --- | --- |
| Example 1 | 4.5 | 6.0 | 23 | (0.682, 0.316) |
| Example 2 | 5.3 | 5.1 | 48 | (0.244, 0.771) |
| Example 3 | 5.1 | 12.0 | 4.8 | (0.133, 0.074) |
| Example 4 | 4.3 | 11.0 | 5.2 | (0.133, 0.075) |
| Example 5 | 5.6 | 14.8 | 4.5 | (0.133, 0.074) |
| Example 6 | 4.4 | 11.5 | 5.0 | (0.133, 0.074) |
| Example 7 | 4.1 | 18.2 | 3.9 | (0.134, 0.075) |
| Example 8 | 4.4 | 11.3 | 5.1 | (0.133, 0.074) |
| Comparative Example 1 | 4.7 | 10.2 | 13 | (0.651, 0.349) |
| Comparative Example 2 | 5.4 | 8.2 | 30 | (0.351, 0.650) |
| Comparative Example 3 | 5.2 | 19.1 | 3.0 | (0.130, 0.150) |
| Comparative Example 4 | 4.4 | 17.6 | 3.3 | (0.130, 0.150) |
| Comparative Example 5 | 5.8 | 23.7 | 2.8 | (0.130, 0.150) |
| Comparative Example 6 | 4.6 | 18.4 | 3.1 | (0.130, 0.150) |

Referring to Table 1, the organic light-emitting devices of Examples 1 through 6 were found to have improved characteristics in terms of driving voltage, current density, luminescent efficiency, and color coordinates, as respectively compared to the organic light-emitting devices of Comparative Examples 1 through 6.

In addition, as is apparent from Table 1, the organic light-emitting devices of Examples 7 and 8 had similar characteristics in terms of driving voltage, current density, emission efficiency and color coordinates, to those of the organic light-emitting devices of Examples 1 through 7.

As described herein, an organic light-emitting device according to one or more embodiments of the invention may have improved emission efficiency and lifetime characteristics, and may prevent image sticking and black non-uniformity. Thus, the organic light-emitting device may produce higher quality images.

While the invention has been particularly shown and described with reference to exemplary embodiments thereof, it will be understood by those of ordinary skill in the art that various changes in form and details may be made therein without departing from the spirit and scope of the invention, the scope of which is defined by the following claims and their equivalents.

What is claimed is:

1. An organic light-emitting display device comprising:
a first electrode;
at least three hole transport layers;
a plurality of intermediate charge generating layers, each of the intermediate charge generating layers consisting essentially of at least one material selected from the group consisting of 1,4,5,8,9,12-hexaazatriphenylene-hexanitrile and tetracyanoquinodimethane (TCNQ), a first of the intermediate charge generating layers positioned between a first and a second of the hole transport layers and a second of the intermediate charge generating layers positioned between the second and a third of the hole transport layers;
an emission layer;
a plurality of electron transport layers; and
a second electrode,
wherein the emission layer comprises a host, an emitting dopant and an auxiliary dopant, the host and the auxiliary dopant able to transport different types of carriers, and wherein the emission layer comprises at least one layer selected from the group consisting of a red emission layer, a blue emission layer and a green emission layer.

2. The organic light-emitting device of claim 1, wherein the emission layer comprises a red emission layer and a host of the red emission layer comprises at least one material selected from the group consisting of bis{2-(2-hydroxyphenyl)benzothiazolate}zinc and bis-(2-methyl-8-quinolinolate)-4-(phenylphenolate)aluminum.

3. The organic light-emitting device of claim 2, wherein an emitting dopant of the red emission layer comprises at least one material selected from the group consisting of an iridium complex and a platinum complex.

4. The organic light-emitting device of claim 2, wherein an auxiliary dopant of each of the red emission layer, the blue emission layer and the green emission layer comprises a phenylamine derivative.

5. The organic light-emitting device of claim 1, wherein the emission layer comprises a blue emission layer and/or a green emission layer and a host of each of the blue emission layer and the green emission layer comprises at least one material selected from the group consisting of an anthracene derivative and a carbazole-based compound.

6. The organic light-emitting device of claim 5, wherein an emitting dopant of the blue emission layer comprises at least one material selected from the group consisting of 2,5,8,11-tetra-tert-butylphenylene and a styryl derivative.

7. The organic light-emitting device of claim 5, wherein an emitting dopant of the green emission layer comprises at least one material selected from the group consisting of an iridium complex and an anthracene derivative.

8. The organic light-emitting device of claim 1, wherein an amount of the emitting dopant in the emission layer is in a range of about 0.1 to about 49 parts by weight based on 100 parts by weight of the host, and an amount of the auxiliary dopant in the emission layer is in a range of about 0.1 to about 49 parts by weight based on 100 parts by weight of the host.

9. The organic light-emitting device of claim 1, wherein the plurality of electron transport layers comprises at least one layer selected from the group consisting of a first electron transport layer including a first electron transport material, and a second electron transport layer including a second electron transport material and a metal compound represented by Formula 1 below:

$$X_aY_b \qquad \text{Formula 1}$$

wherein
X is an alkali metal, an alkali earth metal or a transition metal;
Y is a Group 17 element or a C1-C20 organic group;
a is an integer from 1 to 3; and
b is an integer from 1 to 3.

10. The organic light-emitting device of claim 9, wherein the metal compound of Formula 1 comprises at least one compound selected from the group consisting of lithium quinolate, sodium quinolate, lithium acetoacetate, magnesium acetoacetate, lithium fluoride, cesium fluoride, and sodium fluoride.

11. The organic light-emitting device of claim 9, wherein an amount of the metal compound of Formula 1 is in a range of about 20 to about 60 parts by weight based on 100 parts by weight of the second electron transport layer.

12. The organic light-emitting device of claim 9, wherein each of the first electron transport material and the second electron transport material comprises independently at least one material selected from the group consisting of bis(10-hydroxybenzo[h]quinolinato)beryllium(Bebq2) represented by Formula 2 below, a derivative thereof, 8-hydroxyquinoline zinc (Znq2) and (8-hydroxyquinoline)aluminum (Alq3).

Formula 2

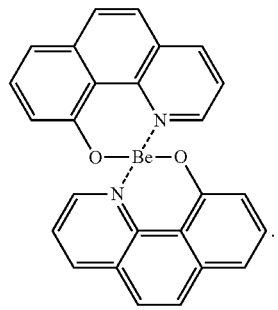

Formula 2

13. The organic light-emitting device of claim 1, wherein each of the hole transport layers comprises at least one material selected from the group consisting of N,N'-diphenyl-N,N-di(1-naphthyl)-1,1'-biphenyl-4,4'-diamine and N,N'-diphenyl-N,N'-di(3-methylphenyl)-1,1'-biphenyl-4,4'-diamine.

14. The organic light-emitting device of claim 1, further comprising a metal reflection layer.

15. The organic light-emitting device of claim 14, wherein the metal reflection layer comprises at least one metal selected from the group consisting of silver (Ag) and aluminum (Al).

16. The organic light-emitting device of claim 1, further comprising an electron injection layer.

* * * * *